United States Patent
Aoi

(10) Patent No.: US 7,648,908 B2
(45) Date of Patent: Jan. 19, 2010

(54) METHOD FOR FORMING INLAID INTERCONNECT

(75) Inventor: Nobuo Aoi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/247,507

(22) Filed: Oct. 8, 2008

(65) Prior Publication Data

US 2009/0098726 A1    Apr. 16, 2009

(30) Foreign Application Priority Data

Oct. 12, 2007    (JP) .............................. 2007-266681

(51) Int. Cl.
    *H01L 21/4763*    (2006.01)
(52) U.S. Cl. ...................................... 438/637; 438/687
(58) Field of Classification Search ................ 438/637, 438/653, 660, 687
    See application file for complete search history.

(56) References Cited

U.S. PATENT DOCUMENTS

| | | | |
|---|---|---|---|
| 6,770,560 B2 * | 8/2004 | Abe | ........................... 438/637 |
| 7,315,084 B2 | 1/2008 | Fujii | |
| 2002/0197856 A1 | 12/2002 | Matsuse et al. | |
| 2004/0009654 A1 | 1/2004 | Abe | |

FOREIGN PATENT DOCUMENTS

JP    2004-047846    2/2004

* cited by examiner

*Primary Examiner*—Jack Chen
(74) *Attorney, Agent, or Firm*—McDermott Will & Emery LLP

(57) ABSTRACT

After a groove is formed in an insulating layer formed on a semiconductor substrate, a barrier metal layer is formed on the insulating layer by an ALD process so as to cover the side walls and bottom of the groove, and an impurity layer is formed in or on the surface of the barrier metal layer by an ion implantation process or by an ALD process. Thereafter, the barrier metal layer and the impurity layer are alloyed, and then an inlaid interconnect layer, which is composed of a Cu seed layer and a Cu plating layer, is formed in the groove. Then, an impurity element in the alloyed barrier metal layer is thermally diffused into the inlaid interconnect layer.

9 Claims, 7 Drawing Sheets

METHOD FOR FORMING INLAID INTERCONNECT

BACKGROUND OF THE INVENTION

1. Field of the Invention

The present invention relates to a method for forming an inlaid interconnect that has low wiring resistance, high electromigration (EM) resistance, and high reliability.

2. Description of the Related Art

As miniaturization of LSIs has advanced, interconnection RC delay time has increased significantly. To address this, Cu inlaid interconnects having low wiring resistance have started being used instead of conventionally used Al interconnects. Typically, Cu inlaid interconnects are more resistant to EM than Al interconnects. Nevertheless, as interconnects have been miniaturized, the density of current passing through the interconnects has increased, and hence EM resistance needs to be increased even in Cu interconnects.

A known method for increasing the EM resistance of a Cu inlaid interconnect is to diffuse an impurity element (typically a metal element) into the Cu inlaid interconnect. For example, a Cu alloy seed layer to which an impurity element has been added is used as a seed layer underlying a Cu plating, and after the Cu plating layer is formed on the Cu alloy seed layer, a heat treatment is performed to diffuse the impurity element from the Cu alloy seed layer into the Cu plating layer.

However, the impurity element diffusion from the Cu alloy seed layer into the Cu plating layer is diffusion occurring between the films both made of Cu. Thus, there is no energy barrier to the impurity element, allowing the impurity element to diffuse into the entire Cu plating layer. As a result, the resistivity of the Cu interconnect is increased, causing the RC delay time of the interconnect to be increased.

Also, when the Cu alloy seed layer is formed using a sputtering apparatus and then transferred to a plating apparatus to form the Cu plating layer, the surface of the Cu alloy seed layer is exposed to the atmosphere. This causes the impurity element added to the Cu alloy seed layer to be oxidized to form an oxide layer on the surface of the Cu alloy seed layer, resulting in a reduction in the adhesion strength between the Cu alloy seed layer and the Cu plating layer.

In view of these problems, a technique is described in Japanese Laid-Open Publication No. 2004-47846 in which EM resistance is increased by diffusing an impurity element into a Cu plating layer while the adhesion between the Cu plating layer and a Cu seed layer is maintained.

FIGS. 8A to 8C are cross-sectional views illustrating process steps in the method for forming a Cu inlaid interconnect described in Japanese Laid-Open Publication No. 2004-47846.

First, as shown in FIG. 8A, after a groove 102 for an inlaid interconnect is formed in an insulating layer 101 formed on a silicon substrate 100, a barrier metal layer (typically an alloy barrier metal layer) 103, to which an impurity element is added, and a Cu seed layer 104 are consecutively formed on the insulating layer 101 in a sputtering apparatus so as to cover the side walls and bottom of the groove 102. Then, as shown in FIG. 8B, a Cu plating layer 105 is formed on the Cu seed layer 104 so as to fill the groove 102.

Next, as shown in FIG. 8C, part of the Cu plating layer 105, part of the Cu seed layer 104, and part of the alloy barrier metal layer 103 located on the insulating layer 101 are removed so as to expose the surface of the insulating layer 101, thereby filling the groove 102 with the Cu plating layer 105. Thereafter, a heat treatment is performed to diffuse the impurity element existing in the alloy barrier metal layer 103 into the Cu plating layer 105.

In this manner, when the impurity element is diffused from the alloy barrier metal layer 103 into the Cu plating layer 105, a energy barrier to the diffusion of the impurity element is formed at the interface between the alloy barrier metal layer 103 and the Cu plating layer 105 (including the Cu seed layer 104), thereby suppressing the diffusion into the Cu plating layer 105. In addition, the consecutive formation of the alloy barrier metal layer 103 and the Cu seed layer 104 in the sputtering apparatus prevents exposure of the impurity element added to the alloy barrier metal layer 103 to the atmosphere and the resultant oxidation thereof. Accordingly, an inlaid Cu interconnect in which increase in wiring resistivity is suppressed and adhesion is maintained is formed.

SUMMARY OF THE INVENTION

However, the inlaid Cu interconnect formed by the method described in Japanese Laid-Open Publication No. 2004-47846, which is effective in suppressing increase in wiring resistance and maintaining adhesion, has the following problem.

The alloy barrier metal layer 103 to which the impurity element is added is formed by a sputtering process. Therefore, as the aspect ratio of the groove 102 for the inlaid interconnect is increased relatively to the miniaturization of LSIs, it becomes difficult to form the alloy barrier metal layer 103 and the Cu seed layer 104 on the side walls and bottom of the groove 102 in such a manner as to cover these side walls and bottom with good coverage. Consequently, if the alloy barrier metal layer 103 and the Cu seed layer are formed discontinuously on the side walls and bottom of the groove 102, voids will be generated in the groove 102 when the groove 102 is filled with the Cu plating layer by an electrolytic plating process, leading to a decrease in the reliability of the Cu interconnect.

In view of this, it is therefore a main object of the invention to provide a method for forming an inlaid interconnect having low wiring resistivity, high EM resistance, and high reliability.

In order to achieve the above-described object, the invention employs a method in which after (or before) a barrier metal layer is formed by an atomic layer deposition process (which will be hereinafter referred to as an "ALD" process) so as to cover the side walls and bottom of a groove for an interconnect, an impurity layer is formed in or on a principal surface (the front or back side) of the barrier metal layer and then the barrier metal layer and the impurity layer are alloyed, and thereafter an impurity element is diffused from the thus alloyed barrier metal layer into an inlaid interconnect layer composed of a Cu seed layer and a Cu plating layer.

The use of an ALD process in forming the barrier metal layer enables the barrier metal layer to be formed on the side walls and bottom of the interconnect groove in such a manner as to cover these side walls and bottom with good coverage, and thus also allows the Cu interconnect layer to be formed without generating voids therein when the Cu plating layer is formed in a subsequent process step.

By an ALD process, a barrier metal layer having an impurity element added thereto cannot be formed, however, by separately forming the impurity layer in or on a principal surface of the barrier metal layer and then alloying the barrier metal layer and the impurity layer, a energy barrier to diffusion of the impurity element is formed at the interface between the alloyed barrier metal layer and the Cu interconnect layer as in the case of an alloy barrier metal layer formed by a conventional sputtering process. Thus, when the impurity element is diffused from the alloyed barrier metal layer into the Cu plating layer, diffusion of the impurity element into the entire Cu plating layer is suppressed. Accordingly, it is possible to form the inlaid interconnect having low wiring resistivity, high EM resistance, and high reliability.

The impurity layer provided in or on a principal surface of the barrier metal layer may be formed, for example, by implanting ions of the impurity element into the surface of the barrier metal layer or by deposition on the surface of the barrier metal layer by an ALD process in which a gas containing the impurity element is used as a material. The impurity layer formed by these methods has a thickness as thin as from about several atomic layers to about 10 nm, for example, and hence is sufficiently applicable to an inlaid interconnect having a high aspect ratio.

An inventive method for forming an inlaid interconnect includes the steps of: (a) forming a groove for an interconnect in an insulating layer formed on a semiconductor substrate; (b) forming a barrier metal layer on the insulating layer by an atomic layer deposition process so as to cover side walls and a bottom of the groove; (c) forming an impurity layer in or on a surface of the barrier metal layer, the impurity layer containing an impurity element; (d) alloying the barrier metal layer and the impurity layer; (e) forming a Cu seed layer on the alloyed barrier metal layer and then forming a Cu plating layer so as to fill the groove; (f) removing part of the Cu plating layer, part of the Cu seed layer, and part of the alloyed barrier metal layer located on the insulating layer so as to expose a surface of the insulating layer, thereby forming, in the groove, an inlaid interconnect layer including the Cu seed layer and the Cu plating layer; and (g) causing thermal diffusion of the impurity element existing in the alloyed barrier metal layer into the inlaid interconnect layer.

In the inventive method, in the step (g), the impurity element diffused into the inlaid interconnect layer is preferably distributed at a higher concentration near an interface between the barrier metal layer and the inlaid interconnect layer than in an inner part of the inlaid interconnect layer.

In one embodiment of the invention, in the step (c), the impurity layer is formed by implanting ions of the impurity element into the surface of the barrier metal layer.

In another embodiment of the invention, in the step (c), the impurity layer is formed on the surface of the barrier metal layer by an atomic layer deposition process in which a gas containing the impurity element is used as a material.

The inventive method may further include the step of forming a second barrier metal layer on the impurity layer after the step (c) and before the step (d).

Also, in the step (d), the impurity layer may also be alloyed with the second barrier metal layer.

Furthermore, the step (e) may further include the step of alloying the impurity layer and the Cu seed layer.

Another inventive method for forming an inlaid interconnect includes the steps of: (a) forming a groove for an interconnect in an insulating layer formed on a semiconductor substrate; (b) forming an impurity layer containing an impurity element on the insulating layer by an atomic layer deposition process so as to cover side walls and a bottom of the groove; (c) forming a barrier metal layer on a surface of the impurity layer by an atomic layer deposition process; (d) alloying the impurity layer and the barrier metal layer; (e) forming a Cu seed layer on the alloyed barrier metal layer and then forming a Cu plating layer so as to fill the groove; (f) removing part of the Cu plating layer, part of the Cu seed layer, and part of the alloyed barrier metal layer located on the insulating layer so as to expose a surface of the insulating layer, thereby forming, in the groove, an inlaid interconnect layer including the Cu seed layer and the Cu plating layer; and (g) causing thermal diffusion of the impurity element existing in the alloyed barrier metal layer into the inlaid interconnect layer.

According to the inventive inlaid interconnect formation methods, an impurity layer is formed in or on a principal surface (the front or back side) of a barrier metal layer which is formed by an ALD process on the side walls and bottom of a groove for an interconnect, and then the barrier metal layer and the impurity layer are alloyed, and thereafter an impurity element is diffused from the thus alloyed barrier metal layer into an inlaid interconnect layer composed of a Cu seed layer and a Cu plating layer, thereby enabling the formation of an inlaid interconnect having low wiring resistivity, high EM resistance, and high reliability.

DETAILED DESCRIPTION OF THE INVENTION

Figure 1A:
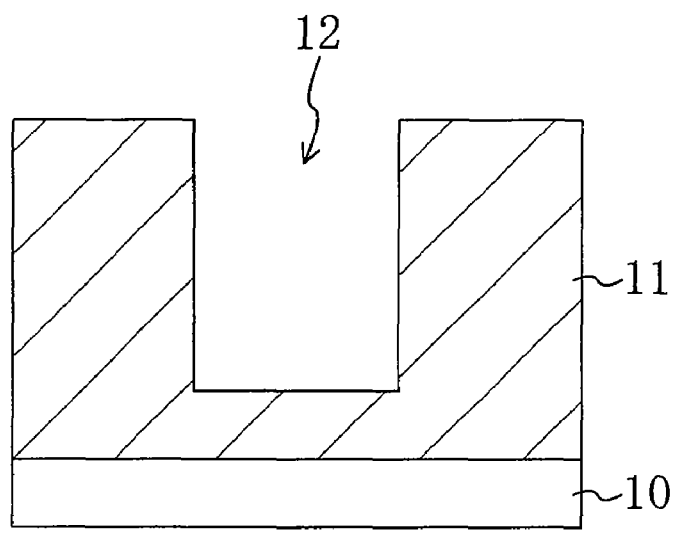
FIGS. 1A to 1C are cross-sectional views illustrating process steps in a method for forming an inlaid interconnect according to a first embodiment of the invention.

Hereinafter, the preferred embodiments of the invention will be described with reference to the accompanying drawings. In the following drawings, for the sake of simplicity, components having substantially the same function are identified by the same reference numerals. It should be noted that the invention is not limited to the following embodiments.

First Embodiment

FIGS. 1A to 1C and FIGS. 2A and 2B are cross-sectional views schematically illustrating process steps in a method for forming an inlaid interconnect according to a first embodiment of the invention.

First, as shown in FIG. 1A, after an insulating layer 11 made of, for example, SiOC having a low dielectric constant is formed on a semiconductor substrate 10, a groove 12 for an inlaid interconnect is formed in the insulating layer 11. The shape of the groove 12 is not particularly limited. For example, the groove 12 may be formed through the insulating layer 11 so as to be connected with a lower interconnect layer (not shown) formed in the semiconductor substrate 10

Figure 1B:
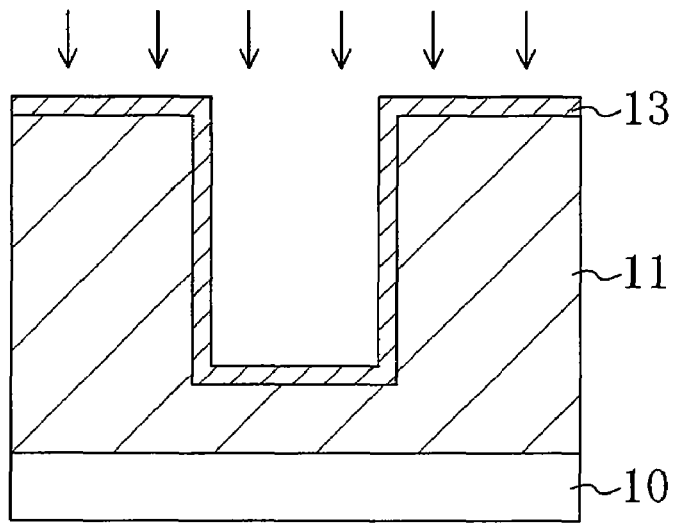

Next, as shown in FIG. 1B, a barrier metal layer 13 having a thickness of about 1 to 10 nm is formed on the insulating layer 11 by an ALD process so as to cover the side walls and bottom of the groove 12. The material of the barrier metal layer 13 is not particularly limited, and Ta, TaN, Ti, TiN, Ru, or the like, or a material obtained by combining these elements may be used, for example.

Figure 1C:
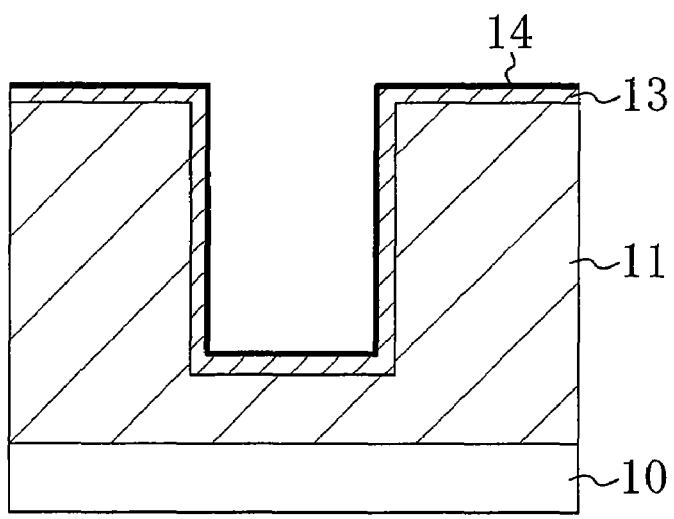

Thereafter, as shown in FIG. 1B, ions of an impurity element are implanted into the surface of the barrier metal layer 13, thereby forming an impurity layer 14 in the surface of the barrier metal layer 13 as shown in FIG. 1C.

The material of the impurity element is not particularly limited so long as the impurity element diffuses into a Cu interconnect layer to thereby produce the effect of increasing EM resistance, and, for example, aluminum (Al), nickel (Ni), cobalt (Co) or the like may be used.

The ion implantation is performed at an acceleration voltage of about 0.2 to 0.5 keV, for example, thereby enabling the formation of the thin impurity layer 14 having a thickness of about 0.1 to 10 nm in the surface of the barrier metal layer 13.

Figure 2A:
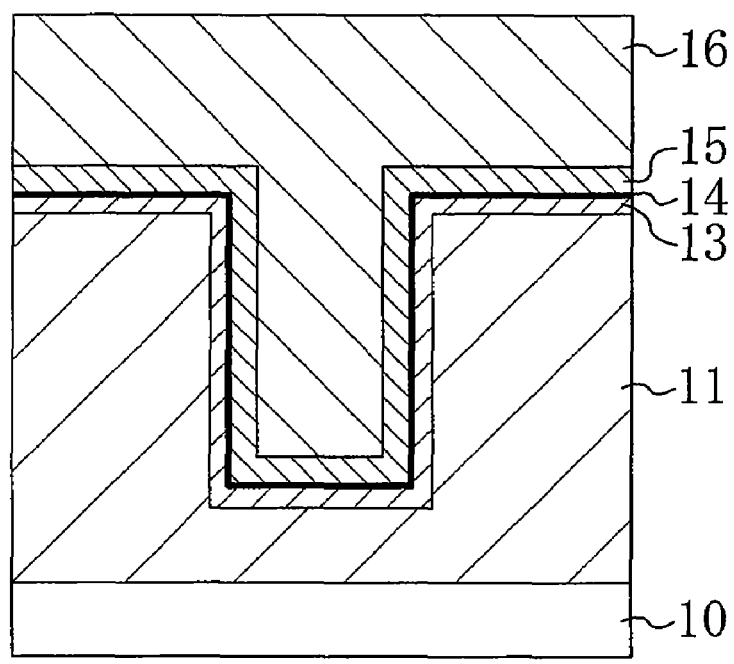
FIGS. 2A and 2B are cross-sectional views illustrating process steps in the inlaid interconnect formation method according to the first embodiment of the invention.

Next, as shown in FIG. 2A, a Cu seed layer 15 is formed by a CVD process, for example, on the barrier metal layer 13 having the impurity layer 14 formed therein, and thereafter, a Cu plating layer 16 is formed on the Cu seed layer 15 by an electroplating process so as to fill the groove 12.

Before or after the formation of the Cu seed layer 15, a heat treatment process step for alloying the barrier metal layer 13 and the impurity layer 14 is performed. The heat treatment process step performed after the formation of the Cu seed layer 15 may be carried out at any time before a process step for diffusing the impurity element from the alloyed barrier metal layer 13 into an inlaid interconnect layer, which process step will be described later. Also, when the heat treatment process step is performed after the formation of the Cu seed layer 15, the impurity layer 14 may be alloyed with the Cu seed layer 15.

Figure 2B:
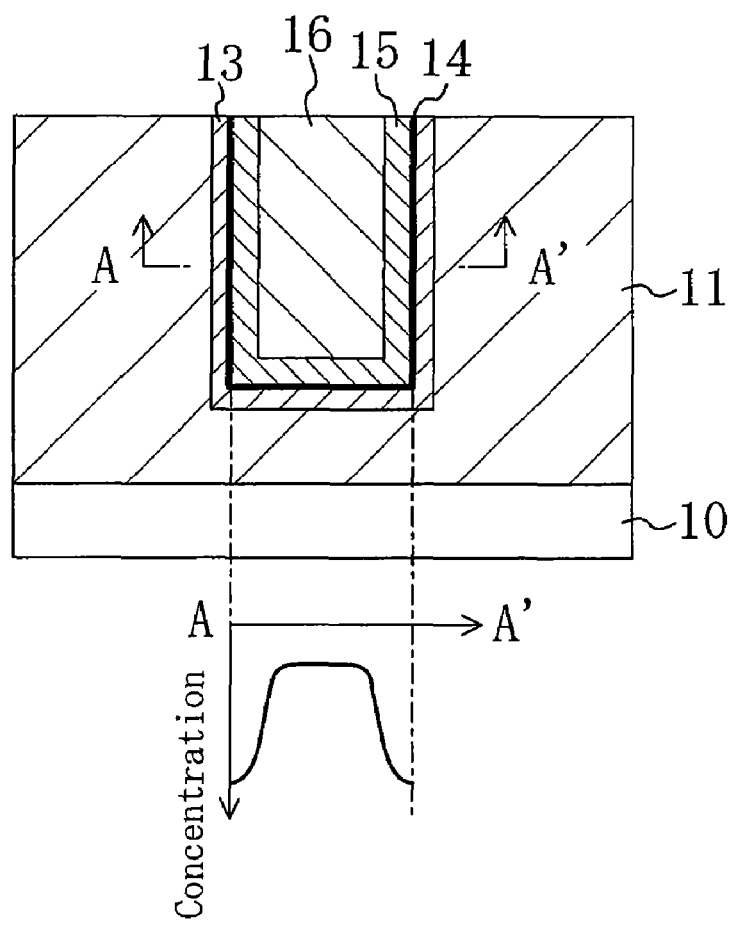

Subsequently, as shown in FIG. 2B, part of the Cu plating layer 16, part of the Cu seed layer 15, and part of the alloyed barrier metal layer 13 located on the insulating layer 11 are removed by a CMP (Chemical Mechanical Polishing) process, for example, so as to expose the surface of the insulating layer 11, thereby forming an inlaid interconnect layer composed of the Cu seed layer 15 and the Cu plating layer 16 in the groove 12.

Thereafter, the heat treatment for diffusing the impurity element existing in the alloyed barrier metal layer 13 into the inlaid interconnect layer is performed. At this time, as shown in a concentration profile in FIG. 2B, the impurity element diffused into the inlaid interconnect layer is distributed at a higher concentration in the vicinity of the interface between the barrier metal layer 13 and the inlaid interconnect layer than in the inner part of the inlaid interconnect layer. This heat treatment may be performed under such conditions that the impurity element in the alloyed barrier metal layer 13 is diffused in the vicinity of the interface between the barrier metal layer 13 and the interconnect layer. For example, the heat treatment may be performed in a nitrogen atmosphere at 400° C. for about 15 minutes.

In this embodiment, the use of an ALD process in forming the barrier metal layer 13 enables the barrier metal layer 13 to be formed on the side walls and bottom of the groove 12 for the interconnect in such a manner as to cover these side walls and bottom with good coverage, and thus also allows the Cu interconnect layer to be formed without creating voids therein when the Cu plating layer 16 is formed in the subsequent process step. In addition, after the impurity layer 14 is formed in the principal surface of the barrier metal layer 13 and the barrier metal layer and the impurity layer are alloyed, the impurity element is diffused from the thus alloyed barrier metal layer into the inlaid interconnect layer composed of the Cu seed layer and the Cu plating layer, thereby enabling the formation of the inlaid interconnect having low wiring resistivity, high EM resistance, and high reliability.

In this embodiment, the impurity layer 14 is formed by an ion implantation process, but may be formed by using gas cluster ion beams or the like, for example.

Second Embodiment

FIGS. 3A to 3C and FIGS. 4A and 4B are cross-sectional views schematically illustrating process steps in a method for forming an inlaid interconnect according to a second embodiment of the invention. In the first embodiment, the impurity layer 14 provided in the surface of the barrier metal layer 13 is formed by implanting ions of an impurity element into the surface of the barrier metal layer 13, whereas this embodiment differs from the first embodiment in employing a method in which an impurity layer is formed on a barrier metal layer 13 by deposition by an ALD process.

The method for forming an inlaid interconnect according to this embodiment will be described below with reference to the accompanying drawings. Detailed description of the same process steps as those of the first embodiment will be omitted.

Figure 3A:
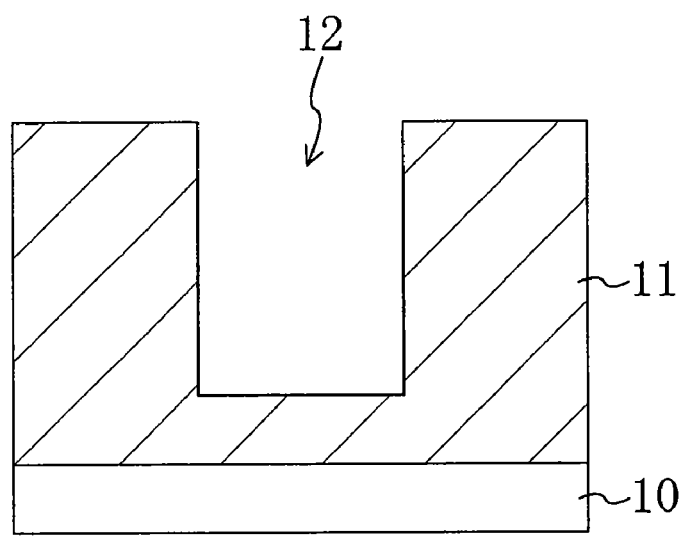
FIGS. 3A to 3C are cross-sectional views illustrating process steps in a method for forming an inlaid interconnect according to a second embodiment of the invention.
Figure 3B:
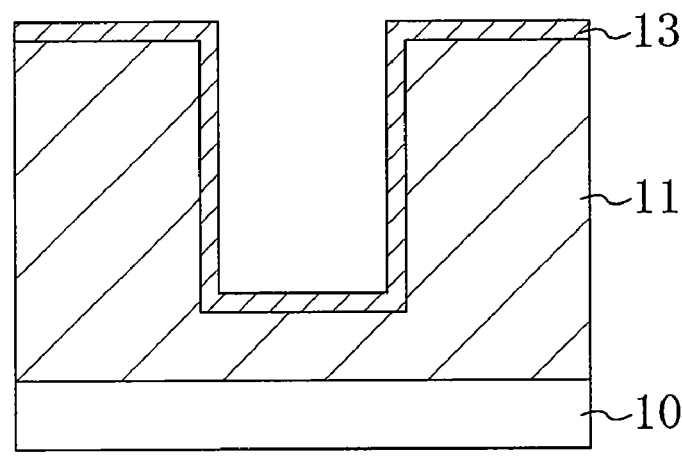

First, as in the first embodiment, as shown in FIGS. 3A and 3B, after a groove 12 for an interconnect is formed in an insulating layer 11 formed on a semiconductor substrate 10, a barrier metal layer 13 is formed on the insulating layer 11 by an ALD process so as to cover the side walls and bottom of the groove 12.

Figure 3C:
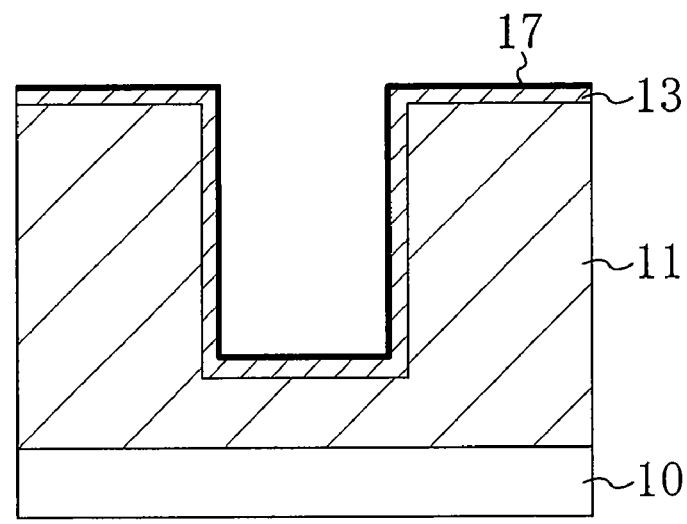

Then, as shown in FIG. 3C, an impurity layer 17 having a thickness of 1 to 10 nm is formed on the surface of the barrier metal layer 13 by deposition by an ALD process in which a gas containing an impurity element is used as a material. In this process step, the material of the impurity element is not particularly limited so long as the impurity element diffuses into a Cu interconnect layer to thereby produce the effect of increasing EM resistance, and, for example, Al, Ni, Co or the like may be used.

Figure 4A:
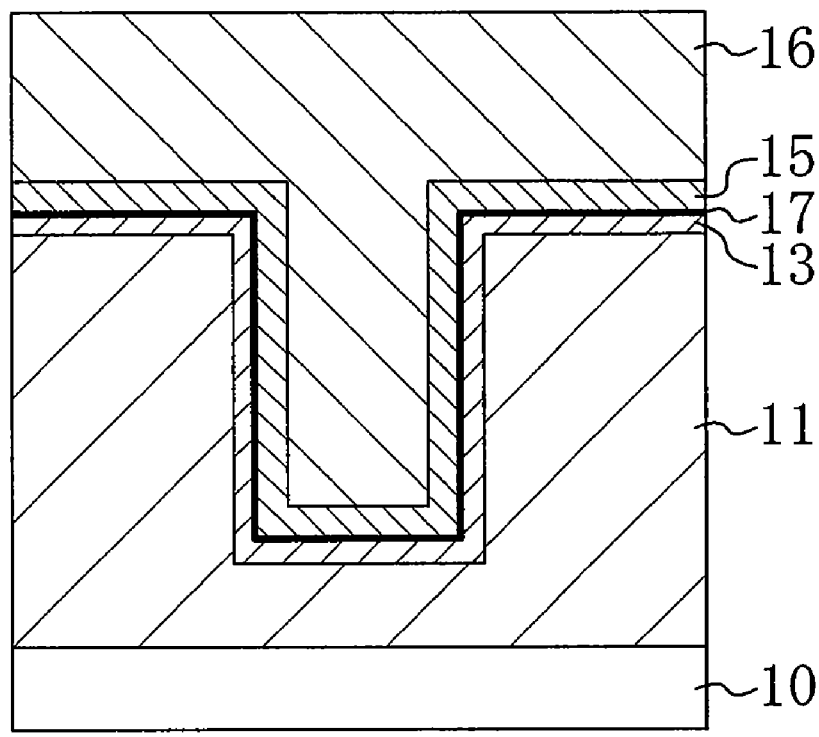
FIGS. 4A and 4B are cross-sectional views illustrating process steps in the inlaid interconnect formation method according to the second embodiment of the invention.
Figure 4B:
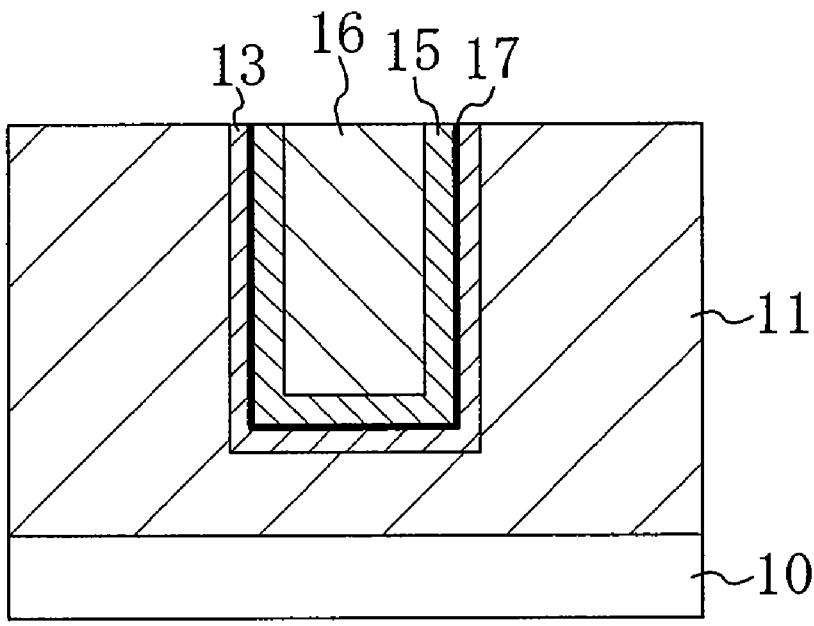

Next, as in the first embodiment, as shown in FIGS. 4A and 4B, after a Cu seed layer 15 is formed over the barrier metal layer 13 having the impurity layer 17 formed thereon, a Cu plating layer 16 is formed so as to fill the groove 12, and then part of the Cu plating layer 16, part of the Cu seed layer 15, and part of the barrier metal layer 13 located on the insulating layer 11 are removed so as to expose the surface of the insulating layer 11, thereby forming an inlaid interconnect layer composed of the Cu seed layer 15 and the Cu plating layer 16 in the groove 12.

Before or after the formation of the Cu seed layer 15, a heat treatment process step for alloying the barrier metal layer 13 and the impurity layer 17 is performed. The heat treatment process step performed after the formation of the Cu seed layer 15 may be carried out at any time before a process step for diffusing the impurity element from the alloyed barrier metal layer 13 into the inlaid interconnect layer. Also, when the heat treatment process step is performed after the formation of the Cu seed layer 15, the impurity layer 17 may be alloyed with the Cu seed layer 15.

Modified Examples of the Second Embodiment

A feature of the invention is that the impurity layer 17 is formed between the barrier metal layer 13 and the Cu seed layer 15, and the impurity element is diffused from the alloyed barrier metal layer 13 into the Cu interconnect layer by a heat treatment. However, the impurity layer 17 does not necessarily have to be in contact with the Cu seed layer 15. When formed by an ALD process, the impurity layer 17 may be formed to have the following relationship with respect to the barrier metal layer 13 in terms of configuration.

Figure 5:
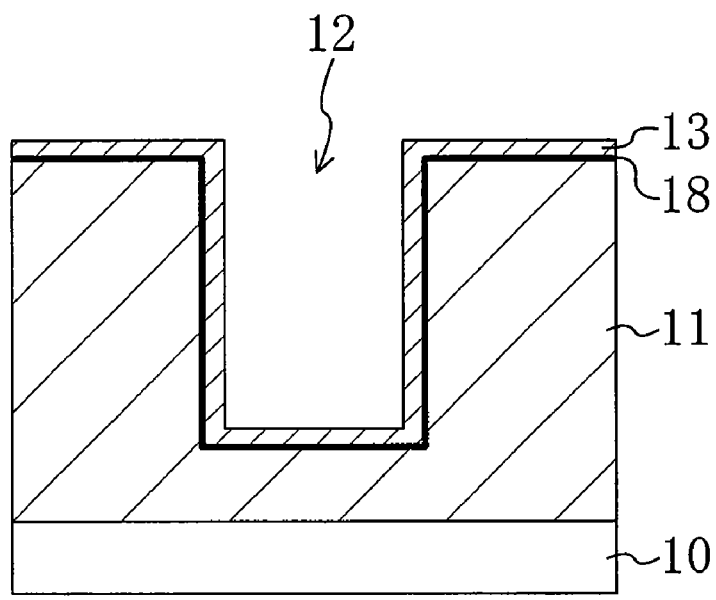
FIG. 5 is a cross-sectional view illustrating the configuration of a barrier metal according to a first modified example of the second embodiment.

FIG. 5 is a cross-sectional view illustrating the configuration of a barrier metal according to a first modified example, in which an impurity layer 18 is formed on an insulating layer 11 by an ALD process so as to cover the side walls and bottom of a groove 12, and then a barrier metal layer 13 is formed on the impurity layer 18.

Figure 6:
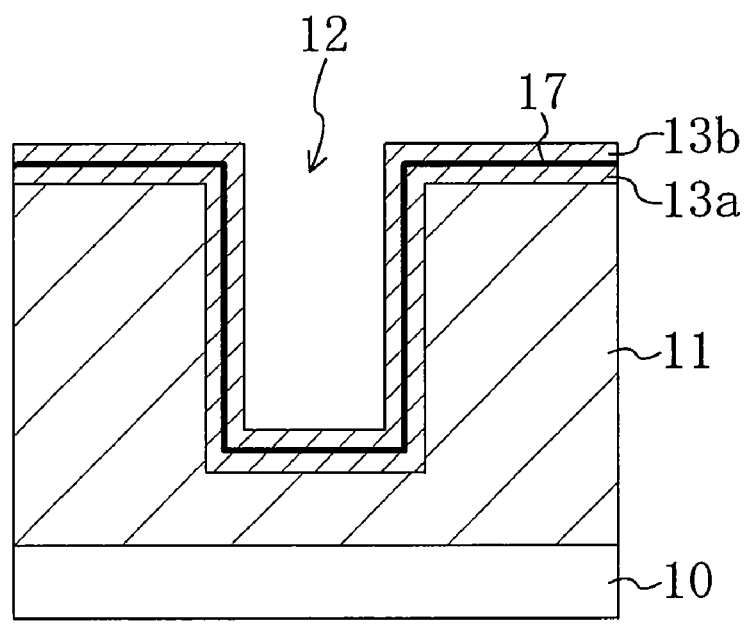
FIG. 6 is a cross-sectional view illustrating the configuration of a barrier metal according to a second modified example of the second embodiment.

FIG. 6 is a cross-sectional view illustrating the configuration of a barrier metal according to a second modified example, in which after a first barrier metal layer 13a is formed on an insulating layer 11 so as to cover the side walls and bottom of a groove 12, an impurity layer 17 is formed on the first barrier metal layer 13a by an ALD process, and then a second barrier metal layer 13b is formed.

In both cases, the impurity layers 17 and 18 are formed so as not to be in contact with a Cu seed layer 15, however, the barrier metal layer 13 (13a and 13b) is alloyed with the impurity layer 17 or 18, thereby enabling an impurity element to be diffused from the alloyed barrier metal layer 13 (13a and 13b) into a Cu interconnect layer.

Figure 7:
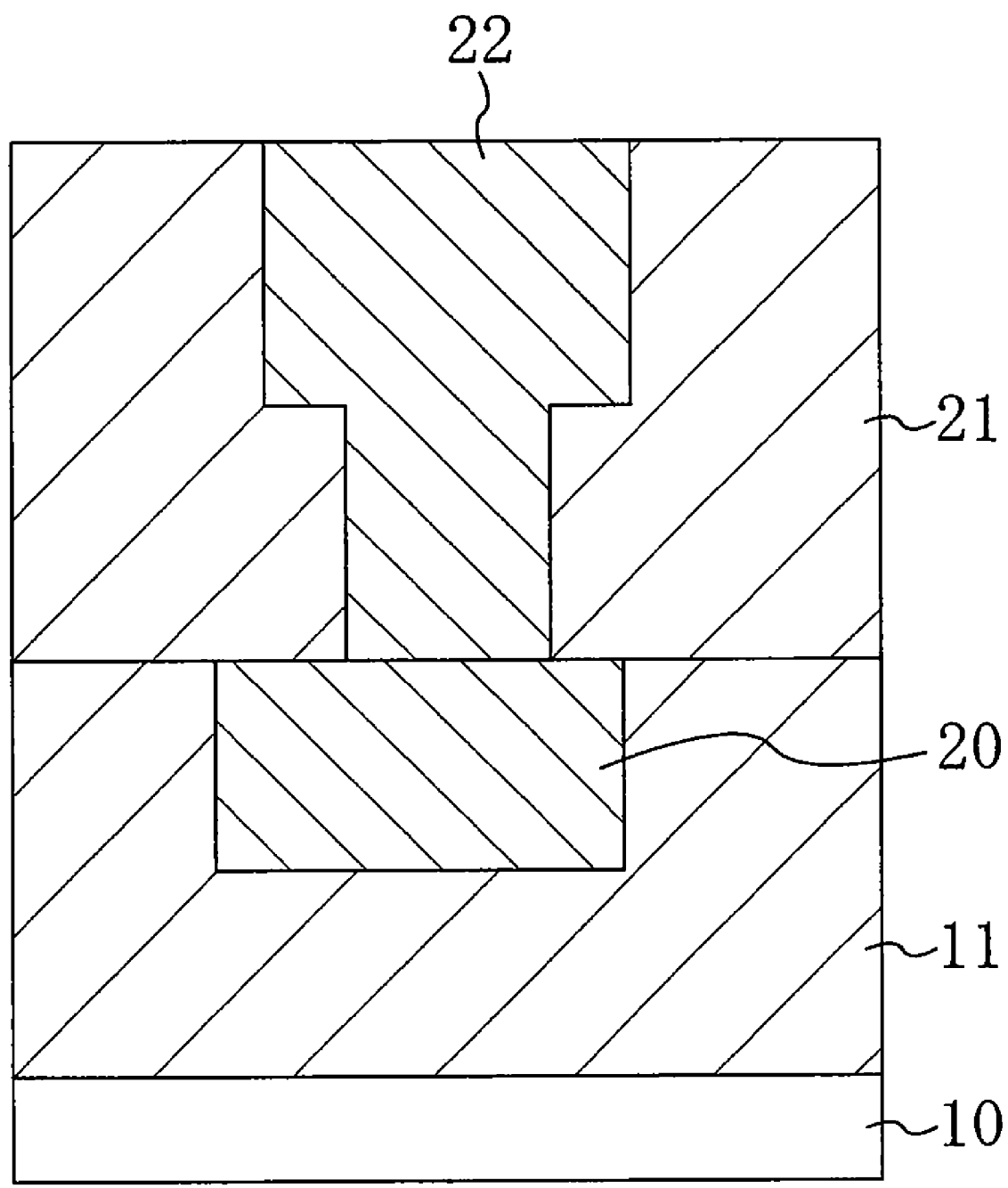
FIG. 7 is a cross-sectional view illustrating another configuration for an interconnect layer according to the invention.
Figure 8A:
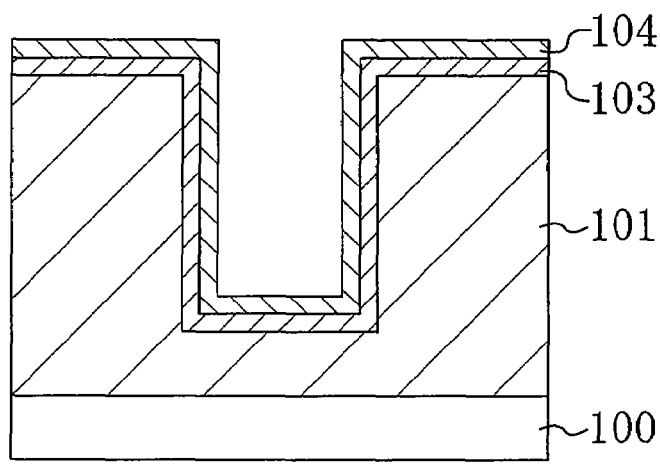
FIGS. 8A to 8C are cross-sectional views illustrating process steps in a conventional method for forming an inlaid interconnect.
Figure 8B:
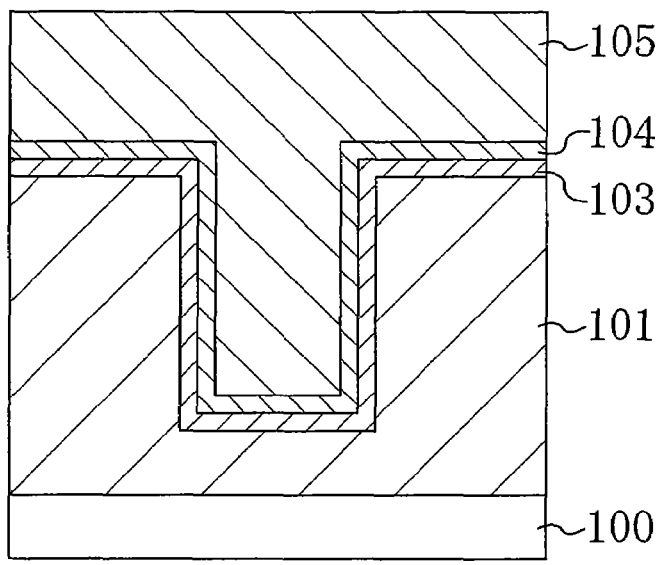
Figure 8C:
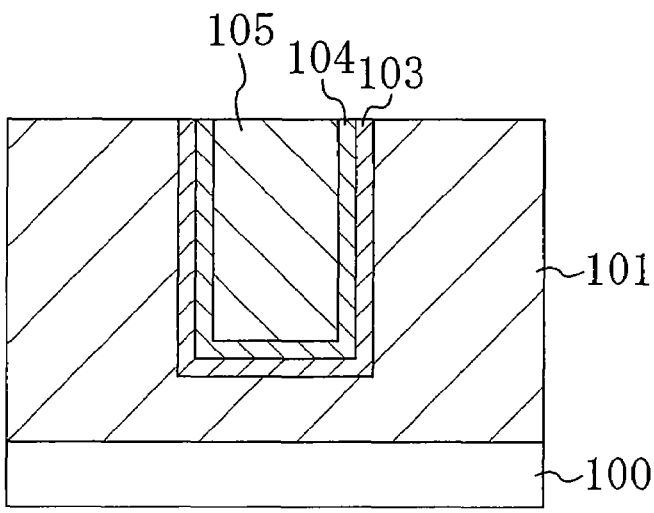

While the invention has been shown as described in the preferable embodiments thereof, the invention is not limited to the foregoing descriptions but is susceptible of various changes and modifications. For example, in the foregoing embodiments, the interconnect layer has an inlaid interconnect structure such as shown in FIG. 2B, but the invention is also applicable to, for example, an interconnect layer 22 having a so-called Dual Damascene structure, in which the interconnect layer 22 is formed in an insulating layer 21 and is connected with a lower interconnect layer 20 formed in a semiconductor substrate 10 as shown in FIG. 7.

Moreover, in the foregoing embodiments, the heat treatment process step of diffusing an impurity element from the alloyed barrier metal layer 13 into the interconnect layer is performed after the process step of forming the inlaid interconnect layer in the groove 12 by a CMP process. Nevertheless, the same effects will be achieved, even if the heat treatment process step is performed after the formation of the Cu seed layer 15 and the Cu plating layer 16 in the groove 12 and before the planarization step by the CMP process, for example.

What is claimed is:

1. A method for forming an inlaid interconnect, comprising the steps of:
   (a) forming a groove for an interconnect in an insulating layer formed on a semiconductor substrate;
   (b) forming a barrier metal layer on the insulating layer by an atomic layer deposition process so as to cover side walls and a bottom of the groove;
   (c) forming an impurity layer in or on a surface of the barrier metal layer, the impurity layer containing an impurity element;
   (d) alloying the barrier metal layer and the impurity layer;
   (e) forming a Cu seed layer on the alloyed barrier metal layer and then forming a Cu plating layer so as to fill the groove;
   (f) removing part of the Cu plating layer, part of the Cu seed layer, and part of the alloyed barrier metal layer located on the insulating layer so as to expose a surface of the insulating layer, thereby forming, in the groove, an inlaid interconnect layer including the Cu seed layer and the Cu plating layer; and
   (g) causing thermal diffusion of the impurity element existing in the alloyed barrier metal layer into the inlaid interconnect layer.

2. The method of claim 1, wherein in the step (g), the impurity element diffused into the inlaid interconnect layer is distributed at a higher concentration near an interface between the barrier metal layer and the inlaid interconnect layer than in an inner part of the inlaid interconnect layer.

3. The method of claim 1, wherein in the step (c), the impurity layer is formed by implanting ions of the impurity element into the surface of the barrier metal layer.

4. The method of claim 1, wherein in the step (c), the impurity layer is formed on the surface of the barrier metal layer by an atomic layer deposition process in which a gas containing the impurity element is used as a material.

5. The method of claim 1, further comprising the step of forming a second barrier metal layer on the impurity layer after the step (c) and before the step (d).

6. The method of claim 5, wherein in the step (d), the impurity layer is also alloyed with the second barrier metal layer.

7. The method of claim 1, wherein the step (e) further includes the step of alloying the impurity layer and the Cu seed layer.

8. The method of claim 1, wherein the impurity element is aluminum, nickel, or cobalt.

9. The method of claim 1, wherein the impurity layer has a thickness of from 0.3 to 10 nm.

* * * * *